(12) United States Patent
Lahiri et al.

(10) Patent No.: US 12,237,829 B2
(45) Date of Patent: Feb. 25, 2025

(54) SOURCE FOLLOWER CIRCUITRY INCLUDING PHASE SHIFT CIRCUITRY

(71) Applicant: XILINX, INC., San Jose, CA (US)

(72) Inventors: Abhirup Lahiri, Dublin (IE); Christophe Erdmann, Cannes (FR)

(73) Assignee: XILINX, INC., San Jose, CA (US)

( * ) Notice: Subject to any disclaimer, the term of this patent is extended or adjusted under 35 U.S.C. 154(b) by 197 days.

(21) Appl. No.: 18/086,534

(22) Filed: Dec. 21, 2022

(65) Prior Publication Data

US 2024/0213979 A1    Jun. 27, 2024

(51) Int. Cl.
*H03M 1/12* (2006.01)
*H03K 17/687* (2006.01)
*H03K 5/00* (2006.01)
*H03K 5/01* (2006.01)

(52) U.S. Cl.
CPC .......... *H03K 17/6874* (2013.01); *H03M 1/12* (2013.01); *H03K 2005/00286* (2013.01); *H03K 5/01* (2013.01)

(58) Field of Classification Search
CPC .......... H03M 1/12; H03K 2005/00286; H03K 3/012; G05F 1/575
USPC .................................................. 341/155, 135
See application file for complete search history.

(56) References Cited

U.S. PATENT DOCUMENTS

| 2014/0225580 A1* | 8/2014 | Carbonini | G05F 1/575 323/280 |
| 2015/0137858 A1* | 5/2015 | Itakura | H03K 19/018521 327/109 |

OTHER PUBLICATIONS

A. M. A. Ali et al., "A 14 Bit 1 GS/s RF Sampling Pipelined ADC With Background Calibration," IEEE Journal of Solid-State Circuits, vol. 49, No. 12, pp. 2857-2867, Dec. 2014.

* cited by examiner

*Primary Examiner* — Peguy Jean Pierre
(74) *Attorney, Agent, or Firm* — Patterson + Sheridan, LLP

(57) ABSTRACT

An electronic system includes a source follower circuitry that functions as an input driver. The source follower circuitry includes a first input transistor, first current source circuitry, and first phase shift circuitry. The first input transistor includes a first node coupled to a first voltage node, a second node coupled to a first output node, and a gate node coupled to a first input node. The gate node receives a first input signal via the first input node. The first current source circuitry coupled to the first output node and configured to generate a first bias current. The first phase shift circuitry is coupled to the first current source circuitry. The first phase shift circuitry generates a first phase shift signal to modulate the first current source circuitry to reduce signal drop across the first input transistor.

20 Claims, 6 Drawing Sheets

SOURCE FOLLOWER CIRCUITRY INCLUDING PHASE SHIFT CIRCUITRY

TECHNICAL FIELD

Examples of the present disclosure generally relate to source follower circuitry that incudes phase shift circuitry, improving the bandwidth and linearity of the source follower circuitry.

BACKGROUND

Analog-to-digital converter (ADC) circuitry are driven by input drivers. ADC circuitry is used in communication systems (e.g., wireline and wireless communication systems). Closed loop buffers may be used as the input drivers. However, while closed loop buffers have high linearity, closed loop buffers have low bandwidth. Linearity corresponds to a higher difference between an input signal and an output signal. The larger the difference, the lower the linearity. High bandwidth buffers (e.g., source follower circuitries) may be used as the input drivers. However, high bandwidth buffers have low linearity due to the larger output impedance and more signal dependent modulation within the high bandwidth buffers.

SUMMARY

In one example, source follower circuitry includes a first input transistor, first current source circuitry, and first phase shift circuitry. The first input transistor includes a first node coupled to a first voltage node, a second node coupled to a first output node, and a gate node coupled to a first input node. The gate node receives a first input signal via the first input node. The first current source circuitry coupled to the first output node and configured to generate a first bias current. The first phase shift circuitry is coupled to the first current source circuitry. The first phase shift circuitry generates a first phase shift signal to modulate the first current source circuitry to reduce signal drop across the first input transistor.

In one example, a communication system includes a capacitive load, and source follower circuitry that drives the capacitive load. The source follower circuitry includes a first input transistor, first current source circuitry, and first phase shift circuitry. The first current source circuitry includes a first node coupled to a first voltage node, a second node coupled to a first output node, and a gate node coupled to a first input node. The gate node receives a first input signal via the first input node. The first current source circuitry is coupled to the first output node and generates a first bias current. The first phase shift circuitry is coupled to the first current source circuitry, and generates a first phase shift signal to modulate the first current source circuitry to reduce signal drop across the first input transistor.

In one example, a differential source follower circuitry includes first and second input transistors, first and second current source circuitries, and first and second phase shift circuitries. The first input transistor includes a first node coupled to a first voltage node, a second node coupled to a first output node, and a gate node coupled to a first input node. The gate node receives a first input signal via the first input node. The second input transistor includes a first node coupled to the first voltage node, a second node coupled to a second output node, and a gate node coupled to a second input node. The gate node receives a second input signal via the second input node. The first current source circuitry is coupled to the first output node and generates a first bias current. The second current source circuitry is coupled to the second output node and generates a second bias current. The first phase shift circuitry is coupled to the first current source circuitry, and generates a first phase shift signal to modulate the first current source circuitry to reduce signal drop across the first input transistor. The second phase shift circuitry is coupled to the second current source circuitry, and generates a second phase shift signal to modulate the second current source circuitry to reduce signal drop across the second input transistor.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

DETAILED DESCRIPTION

Figure 1:
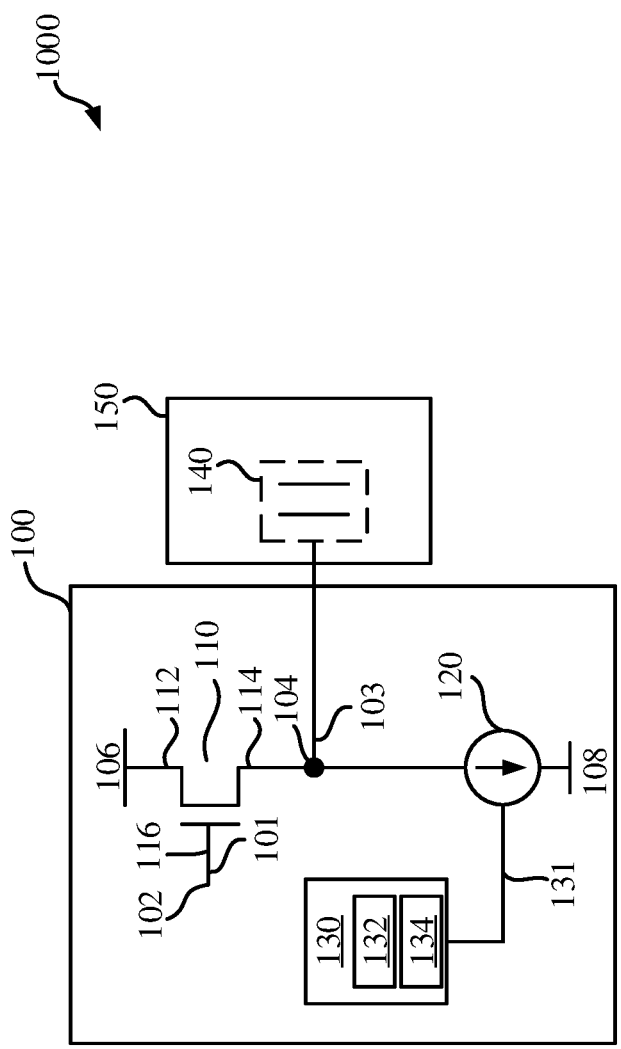
FIG. 1 illustrates a block diagram of a communication system.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the features or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Communication systems may be wireline communication systems or wireless communication systems. In one or more examples, a communication system includes analog-to-digital converter (ADC) circuitry that is driven by a signal input driver. In one example, a signal input driver is source follower circuitry. A source follower circuitry includes one or more input transistors that receive an input signal and a current source. The source follower circuitry generates an output signal based on the input signal, and the output signal is driven onto the ADC circuitry.

A communication system may be a high bandwidth (e.g., 30 GHz or more) communication system. In such communication systems, the non-linearity of the signal input driver (e.g., the current source follower circuitry) may increases. The loss of linearity, or more non-linearity, corresponds to a larger drop in voltage between an input signal and an output signal (e.g., a change between the output signal and input signal). To improve the linearity of a high bandwidth current source follower circuitry, residual current signal due to a load capacitance (e.g., capacitance of ADC circuitry) within the source follower circuitry is mitigated. Mitigating the residual signal includes reducing or canceling the residual current signal or the effects of the residual signal.

In the following, source follower circuitry including phase shift circuitry that applies a phase shift to the output signal to generate a phase shifted signal is described. The phase shifted signal is applied to the current source circuitry to modulate the current source circuitry, mitigating the residual current signal (or the effects of the residual current signal) within the corresponding source follower circuitry, and increasing the linearity of the corresponding source follower circuitry. In one or more examples, the source follower circuitry is a differential source follower circuitry that outputs a positive and negative output signal via positive and negative source follower circuitry segments, respectively. In such examples, the positive output signal is phase shifted to generate a phase shifted signal that is used to mitigate a residual current source in the negative source follower circuitry segment. Further, the negative output signal is phase shifted to generate a phase shifted signal that is used to mitigate a residual current source in the positive source follower circuitry segment. In another example, the positive input signal is phase shifted to generate a phase shifted signal that is used to mitigate a residual current source in the negative source follower circuitry segment. Further, the positive input signal is phase shifted (to generate a phase shifted signal that is used to mitigate a residual current source in the positive source follower circuitry segment.

Increasing the linearity (e.g., decreasing a voltage drop across gate and source nodes of an input transistor and decreasing signal drop between an input and output of source follower circuitry) increases the supported operating bandwidths of the corresponding source follower circuitry. In one example, a source follower circuitry that includes phase shift circuitry as described herein lowers the signal dependent modulation across the input device (e.g., the input transistor) which allows the output signal to closely track the input signal (e.g., providing an increased linearity) with a wider bandwidth and lower output signal distortion as compared to other source follower circuitries.

FIG. 1 illustrates a circuit diagram of source follower circuitry 100, according to one or more examples. The source follower circuitry 100 includes transistor 110, current source circuitry 120, and phase shift circuitry 130. The source follower circuitry 100 drives the load 140. The load (e.g., a capacitance load or other type of load) 140 may be a sampling capacitor of ADC converter circuitry 150 or another circuit element.

The source follower circuitry 100 receives an input signal 101 via input node 102. The source follower circuitry 100 generates an output signal 103 at the output node 104 based on the input signal 101. The output signal is output via the output node 104. In one example, the output signal 103 is driven onto the load 140 via the output node 104.

The transistor 110 is an n-channel metal-oxide semiconductor (NMOS) transistor. The transistor 110 includes a drain node 112 coupled (e.g., connected) to a voltage node 106. The voltage node 106 receives a first voltage signal. For example, the voltage node 106 receives a first voltage signal from a power supply or another voltage source. The first voltage signal may be referred to as VDD.

The transistor 110 further includes a source node 114. The source node 114 is coupled to the output node 104. Further, the transistor 110 includes a gate node 116. The gate node 116 is coupled to the input node 102 and receives the input signal 101. In one or more examples, while the transistor 110 is described above as being an NMOS transistor, the transistor 110 may be a p-channel metal-oxide semiconductor (PMOS) transistor.

The current source circuitry 120. The current source circuitry 120 is coupled to the output node 104 and generates a current signal. In one example, the current source circuitry 120 functions as a current sink to bias current within the source follower circuitry 100. In one example, the current source circuitry 120 is further coupled to the voltage node 108. The voltage node 108 receives a second voltage signal from a power supply or other voltage generation circuitry. In one example, the second voltage has a voltage level that is less than or greater than the voltage level of the first voltage signal received at the voltage node 106. In one example, the second voltage is a ground or common voltage, and the voltage node 108 is a ground or common voltage node.

In one or more examples, the output signal 103 corresponds to the input signal 101. In one example, the input signal 101 may be a sinusoidal signal. In such an example, the output signal 103 is a sinusoidal signal. In one or more examples, the output signal 103 includes a direct current (DC) shift with reference to the input signal 101. In one or more examples, the output signal 103 may differ from input signal 101, corresponding to a non-linearity of the source follower circuitry 100. For example, signal drop may occur between the input node 102 (or gate node 116) and the output node 104 (or source node 114) due to the load 140. The signal drop may correspond to non-linearity into the source follower circuitry 100, negatively affecting the output signal 103. For example, the non-linearity may cause the output signal 103 to differ from the input signal 101, degrading the performance of the source follower circuitry 100, limiting the bandwidth of the source follower circuitry 100.

In one or more examples, the phase shift circuitry 130 modulates the current source circuitry 120 to mitigate a non-linearity introduced by the load 140. For example, the load 140 may generate a residual current signal within the source follower circuitry 100 that increases the non-linearity of the current source circuitry 120. Mitigating the non-linearity (or the residual current signal) introduced by the load 140 allows the output signal 103 to more closely match (or track) the input signal 101. Mitigating the non-linearity may include reducing and/or canceling the non-linearity (or the effects of the non-linearity). The phase shift circuitry 130 is coupled to the current source circuitry 120. In one example, the phase shift circuitry 130 generates a signal 131 that is phase shifted by N degrees from the signal output (e.g., the output signal 103) by the transistor 110. N is greater than 0 degrees. In one example, the N is at least about 45 degrees, about 60 degrees, or about 90 degrees. In one or more example, N corresponds to a phase shift that mitigates the non-linearity introduced by the load 140. The phase shift circuitry 130 includes capacitor 132 and resistor 134. The capacitor 132 and the resistor 134 form a resistor-capacitor (RC) network that applies the phase shift to an input signal to the phase shift circuitry 130 to generate the signal 131 that modulates the current source circuitry 120. In one example, the resistor-capacitor network introduces a phase shift that differs from the nominal phase shift of 90 degrees of the output signal as the frequency of the input signal increases.

In one or more examples, the additional phase shift maintains the nominal phase shift to be about 90 degrees.

In one or more examples, gain is applied to the signal 131. Further, the signal 131 may correspond to a negative capacitance having a magnitude of about the capacitance value of the load 140. The input to the phase shift circuitry 130 may be the output signal 103, the input signal 101, or another signal.

In one example, modulating the current source circuitry 120 with the signal 131 that is phase shifted with respect to the output signal 103 reduces a residual current signal, reducing a change in voltage (e.g., drop in signal) between gate node 116 and source node 114 (e.g., voltage VGS of the transistor 110). Reducing the change in VGS of the transistor 110 increases the linearity of source follower circuitry 100 as the output signal 103 more closely tracks (e.g., matches or follows) the input signal 101 as compared to source follower circuities 100 that do not include phase shift circuitry 130. Further, reducing the change in VGS allows the source follower circuitry 100 to support higher operating bandwidths with greater non-linearity as compared to source follower circuities 100 that do not include phase shift circuitry 130.

In one example, the source follower circuitry 100 and the ADC circuitry 150 are part of the electronic system 1000. In one example, the electronic system 1000 is communication system, such as a wireline or wireless communication system. In other examples, the electronic system 1000 may be other types of systems.

Figure 2:
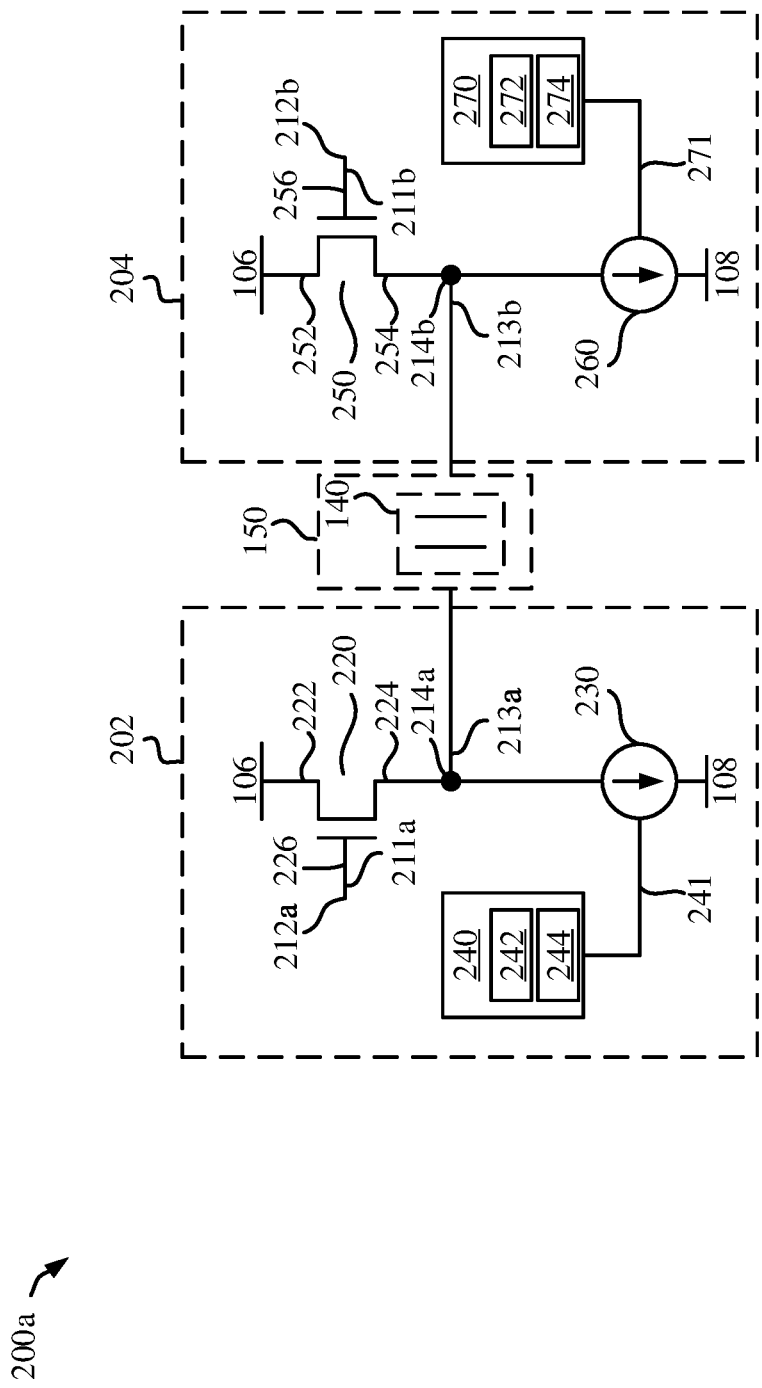
FIG. 2 illustrates a circuit diagram of source follower circuitry.

FIG. 2 illustrates a circuit diagram of source follower circuitry 200a, according to one or more examples. The source follower circuitry 200a is a differential source follower circuitry 200a. The source follower circuitry 200a includes segments (source follower circuitry segments) 202 and 204. Each of the segments 202 and 204 are configured similar to the source follower circuitry 100 of FIG. 1. For example, the segment 202 includes a transistor 220, current source circuitry 230, and phase shift circuitry 240. The transistor 220 is configured similar to the transistor 110, the current source circuitry 230 is configured similar to the current source circuitry 120, and the phase shift circuitry 240 is configured similar to the phase shift circuitry 130. In one example, the transistor 220 includes a drain node 222 that is coupled to the voltage node 106, a source node 214 coupled to an output node 214a, and a gate node 226 coupled to an input node 212a. The gate node 226 receives the input signal 211a via the input node 212. Further, the output signal 213b is output via the output node 214a.

The current source circuitry 230 is coupled to the output node 214a and the voltage node 108. The current source circuitry 230 generates a bias current signal based on the voltage at output node 214a.

The phase shift circuitry 240 is coupled to the current source circuitry 230. The phase shift circuitry 240 modulates the current source circuitry 230 to mitigate a drop in voltage (e.g., signal drop) between the gate node 226 and the source node 224 and reduce residual current as is described above with regard to the phase shift circuitry 130 of FIG. 1.

The phase shift circuitry 240 includes capacitor 242 and resistor 244. The capacitor 242 and the resistor 244 form an RC network that applies a phase shift to an input signal to generate the modulation signal 241 that modulates the current source circuitry 230.

The segment 204 includes a transistor 250, current source circuitry 260, and phase shift circuitry 270. The transistor 250 is configured similar to the transistor 110, the current source circuitry 260 is configured similar to the current source circuitry 120, and the phase shift circuitry 270 is configured similar to the phase shift circuitry 130. The transistor 250 includes a drain node 252 that is coupled to the voltage node 106, a source node 254 coupled to an output node 214b, and a gate node 256 coupled to an input node 212b. The gate node 256 receives the input signal 211b via the input node 212b. Further, the output signal 213b is output via the output node 214b.

The input signals 211a and 211b form a differential input signal. In one example, the input signal 211a and the input signal 211b have an opposite sign from each other, and have the same magnitude. The input signal 211a may be referred to as a positive input signal and the input signal 211b may be referred to as a negative input signal. In one example, the input signal 211b is the inverse of the input signal 211a. The output signals 213a and 213b form a differential output signal. In one example, the output signal 213a and the output signal 213b have an opposite sign from each other, and have the same magnitude. The output signal 213a may be referred to as a positive output signal and the output signal 213b may be referred to as a negative output signal. In one example, the output signal 213b is the inverse of the output signal 213a.

The current source circuitry 260 is coupled to the output node 214b and the voltage node 108. The current source circuitry 260 generates a bias current signal based on the voltage at output node 214b.

The phase shift circuitry 270 is coupled to the current source circuitry 260. The phase shift circuitry 270 modulates the current source circuitry 260 to mitigate a drop in voltage (e.g., drop in signal) between the gate node 256 and the source node 254 and reduce residual current as is described above with regard to the phase shift circuitry 130 of FIG. 1.

The phase shift circuitry 270 includes capacitor 272 and resistor 274. The capacitor 272 and the resistor 274 form an RC network that applies a phase shift to an input signal to generate the signal 271 that modulates the current source circuitry 260.

The output nodes 214a and 214b are coupled to the load 140. The output signals 213a and 213b are driven onto the load 140 via the output nodes 214a and 214b.

Figure 3:
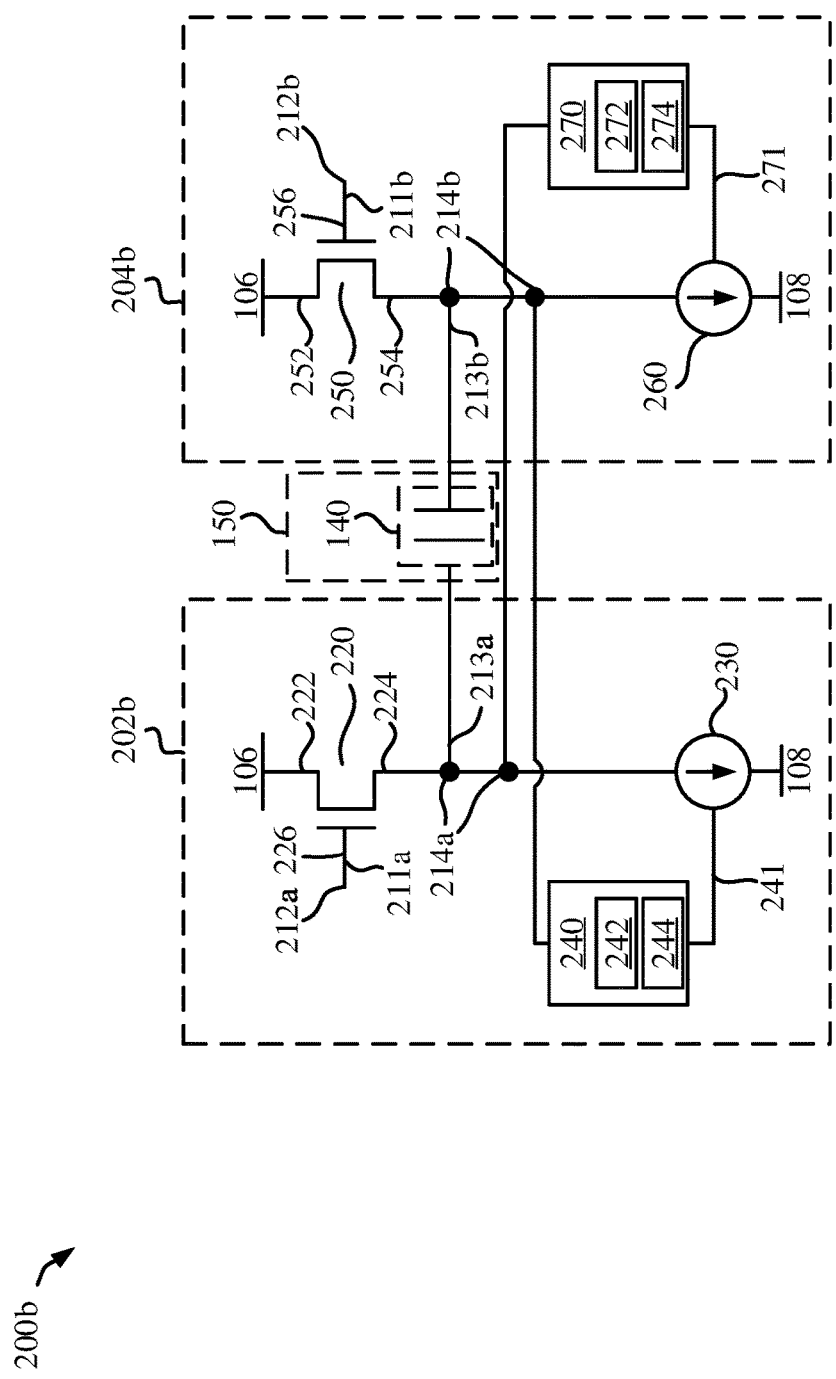
FIG. 3 illustrates a circuit diagram of differential source follower circuitry.

FIG. 3 illustrates a circuit diagram of source follower circuitry 200b, according to one or more examples. The source follower circuitry 200b is configured similar to the source follower circuitry 200a of FIG. 2. In the source follower circuitry 200b, the phase shift circuitries 240 and 270 are respectively coupled to the output nodes 214a, 214b of opposite segments 202b and 204b. For example, the phase shift circuitry 240 is coupled to the output node 214b. Accordingly, the phase shift circuitry 240 receives as the input signal the output signal 213b (e.g., the output signal of the transistor 250 and the input signal to the current source circuitry 260). The phase shift circuitry 240 applies a phase shift to the output signal 213b to generate the modulation signal 241. Further, a gain is applied to the modulation signal 241. The gain is through a transistor (represented as $gm_1$) of the current source circuitry 230 and the resistance ($R_1$) of the resistor 244. In one example, the gain is equal to $gm_1*R_1$. The gain amplifies the capacitance ($C_1$) of the capacitor 242 to a negative capacitance value (e.g., $gm_1*R_1*C_1$). In one example, the negative capacitance value corresponds to the capacitance of load 140.

The phase shift circuitry 270 is coupled to the output node 214a. Accordingly, the phase shift circuitry 270 receives as the input signal the output signal 213b (e.g., the output signal of the transistor 250 and the input signal to the current source circuitry 260). The phase shift circuitry 270 applies a phase shift to the output signal 213a to generate the modulation signal 271. Further, a gain is applied to the modulation signal 271. The gain is through a transistor (represented as $gm_2$) of the current source circuitry 260 and the resistance ($R_2$) of the resistor 274. The gain amplifies the capacitance ($C_2$) of the capacitor 242 to a negative capacitance value (e.g., $gm_2*R_2*C_2$). In one example, the negative capacitance value corresponds to the capacitance of load 140.

Figure 4:
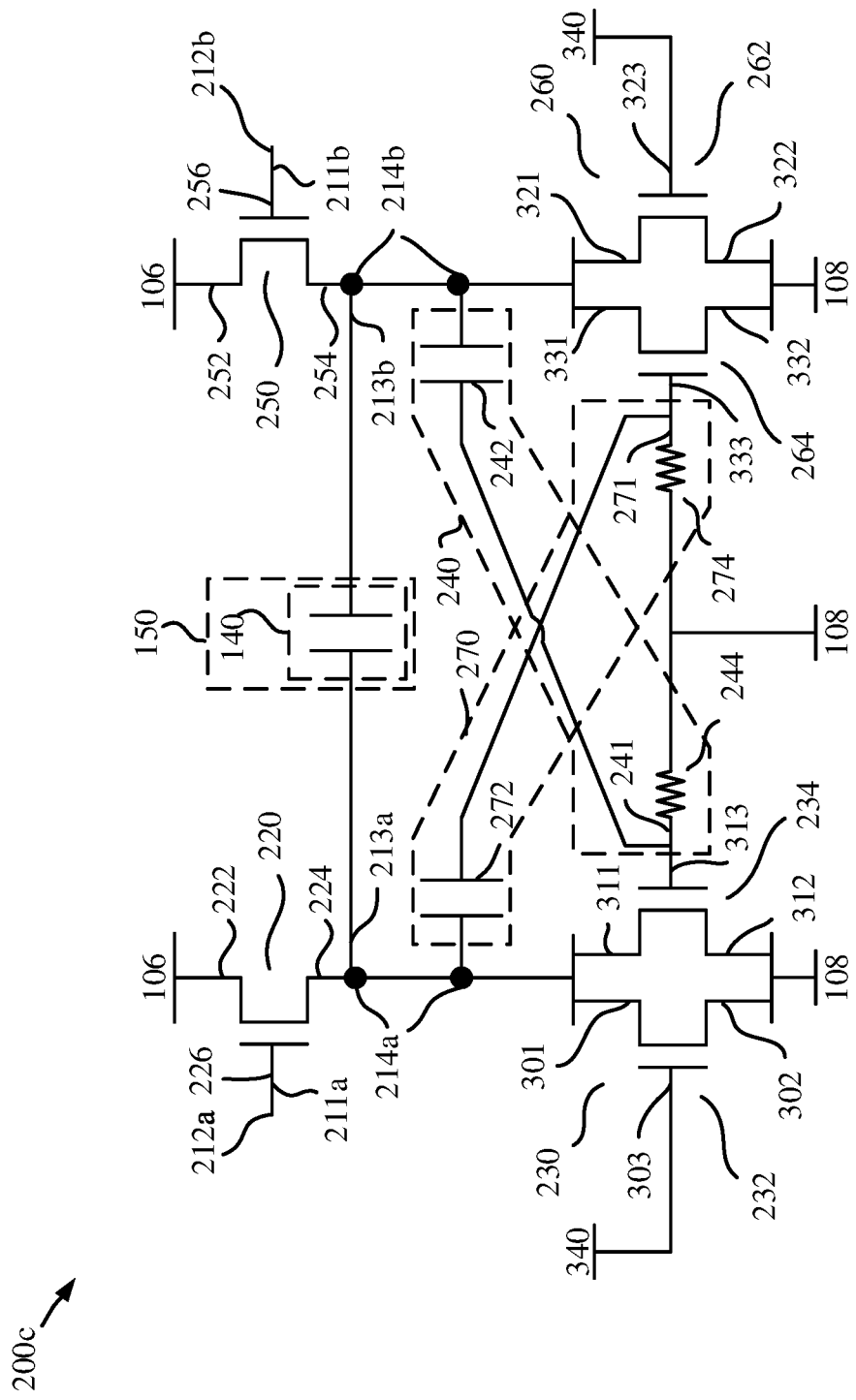
FIG. 4 illustrates a circuit diagram of differential source follower circuitry with phase shift circuitry.

FIG. 4 illustrates a circuit diagram of the source follower circuitry 200c. The source follower circuitry 200c is configured similar to the source follower circuitry 200b and the source follower circuitry 200a. For example, the phase shift circuitry 240 includes the capacitor 242 and the resistor 244. The capacitor 242 and the resistor 244 form an RC network. The capacitor 242 is coupled to the output node 214b. The resistor 244 is coupled to a transistor (e.g., the transistor 234) of the current source circuitry 230 and the voltage node 108. In one example, the capacitor 242 receives the output signal 213b. The capacitor 242 and the resistor 244 generate the modulation signal 241.

The phase shift circuitry 270 includes the capacitor 272 and the resistor 274. The capacitor 272 and the resistor 274 form an RC network. The capacitor 272 is coupled to the output node 214a. The resistor 274 is coupled to a transistor (e.g., the transistor 264) of the current source circuitry 260 and the voltage node 108. In one example, the capacitor 272 receives the output signal 213a. The capacitor 272 and the resistor 274 to generate the signal 271.

The current source circuitry 230 includes transistor 232 and 234. The transistors 232 and 234 are NMOS transistors. However, in other examples, the transistors 232 and 234 may be PMOS transistors. The transistor 232 includes a drain node 301 coupled to the output node 214a, a source node 302 coupled to the voltage node 108, and a gate node 303 coupled to a bias voltage node 340. The bias voltage node 340 receives a third voltage signal (e.g., a bias voltage signal) from a power supply or other voltage supply device. The voltage level of the bias voltage node 340 may be greater than or less that of the voltage node 108 and less than or greater than that of the voltage node 106. The transistor 234 includes a drain node 311 coupled to the output node 214a, a source node 312 coupled to the voltage node 108, and a gate node 303 coupled to the resistor 244 of phase shift circuitry 240.

The current source circuitry 260 includes transistor 262 and 264. The transistors 262 and 264 are NMOS transistors. However, in other examples, the transistors 262 and 264 may be PMOS transistors. The transistor 262 includes a drain node 321 coupled to the output node 214b, a source node 322 coupled to the voltage node 108, and a gate node 323 coupled to a bias voltage node 340. The transistor 264 includes a drain node 331 coupled to the output node 214b, a source node 332 coupled to the voltage node 108, and a gate node 333 coupled to the resistor 274 of phase shift circuitry 270.

As is noted above, the gain of the phase shift circuitry 240 through the transistor 234 ($gm_1$) and combined with the $R_1$ of the resistor 244. Further, $C_1$ of the capacitor 242 is amplified by $gm_1$ and $R_1$ to generate a negative capacitance. The magnitude of the negative capacitance corresponds to the magnitude of the capacitance of the load 140. In one example, the combination of the gain $gm_1$, the resistance value ($R_1$) of the resistor 244, and $C_1$ of the capacitor 242 is less than the capacitance ($C_L$) of the load 140. For example, $gm_1*R_1*C_1<CL$. Further, the combination of the operating frequency ($\omega$), $R_1$ and $C_1$ is less than 1. For example, $\omega*R_1*C_1<1$. Accordingly, in one or more examples, the phase shift in the frequency band of interest is close to 90 degrees.

The gain of the phase shift circuitry 270 through the transistor 264 ($gm_2$) is combined within the $R_2$ of the resistor 274. Further, $C_2$ of the capacitor 272 is amplified by $gm_2$ and Ra to generate a negative capacitance. The magnitude of the negative capacitance corresponds to the magnitude of the capacitance of the load 140. In one example, the combination of the gain $gm_2$, Ra of the resistor 274, and $C_2$ of the capacitor 272 is less than the capacitance (Ct) of the load 140. For example, $gm_2*R_2*C_2<C_L$. Further, the combination of the $\omega$, $R_2$ and $C_2$ is less than 1. For example, $\omega*R_2*C_2<1$. Accordingly, in one or more examples, the phase shift in the frequency band of interest is close to 90 degrees.

In one example, the capacitance value of $C_1$ and $C_2$ is about 50 to 100 femto-farads. The gain of the transistor 234 and 264 is about 10. However, in other examples, other capacitance values and gain values may be used.

Figure 5:
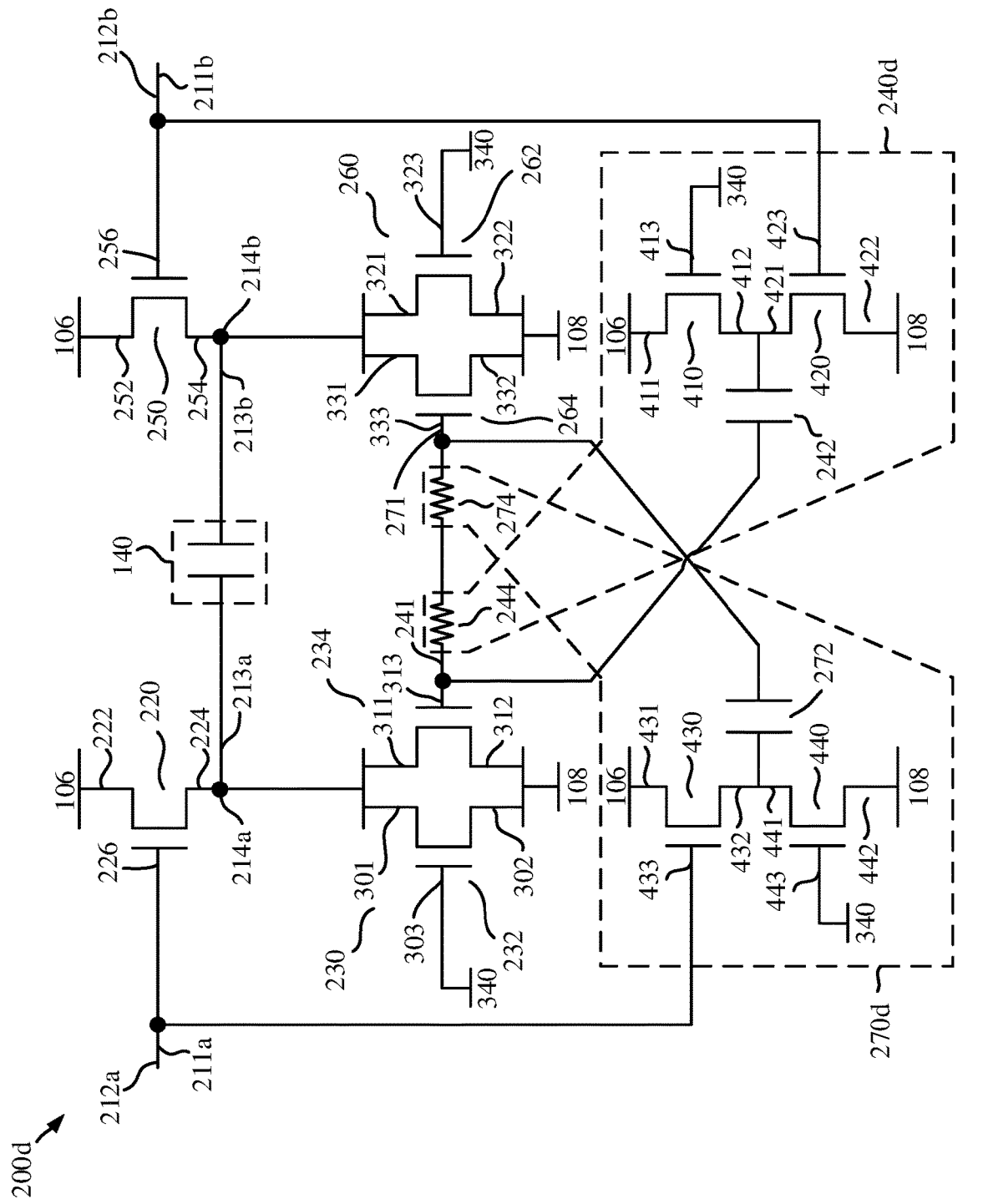
FIG. 5 illustrates a circuit diagram of differential source follower circuitry with phase shift circuitry.

FIG. 5 illustrates a circuit diagram of source follower circuitry 200d, according to one or more examples. The source follower circuitry 200d is configured similar to that of the source follower circuitry 100, 200a, 200b, and 200c. In one example, as compared to the source follower circuitry 200b, the phase shift circuitry 240d is coupled to the input node 212b and receives the input signal 211b. Further, the phase shift circuitry 270d is coupled to the input node 212a and receives the input signal 211a.

The phase shift circuitry 240d includes transistors 410 and 420. As the phase shift circuitry 240 includes transistors 410 and 420, the phase shift circuitry 240d may be referred to as active phase shift circuitry. In examples where the phase shift circuitry lacks transistors (e.g., the phase shift circuitry 240 of FIG. 4), the phase shift circuitry may be referred to as passive phase shift circuitry. The transistors 410 and 420 are NMOS transistors. In other examples, the transistors 410 and 420 are PMOS transistors. The transistor 410 includes a drain node 411 coupled to the voltage node 106, a source node 412 coupled to the capacitor 242, and a gate node 413 coupled to the bias voltage node 340. The transistor 420 includes a drain node 421 coupled to the capacitor 242, a source node 422 coupled to the voltage node 106, and a gate node 423 coupled to the input node 212b. The gate node 423 receives the input signal 211b. The transistors 410 and 420 form a current source circuitry that is configured similar to that of the current source circuitry 230. The phase shift circuitry 240d receives the input signal 211b and generates the signal (modulation signal) 241 by applying a phase shift to the input signal 211b to mitigate a change in signal between the gate node 226 and the source node 224 and mitigate residual current. Further, a gain through the transistor 234 applies a gain to the signal 241 to further mitigate a change in signal between the gate node 226 and the source node 224 and mitigate residual current. The transistors 410 and 420 increase the stability of the signal 241, and increase the supported bandwidth of the source follower circuitry 200d as compared to source follower circuitry that does not include the transistors 410 and 420.

The phase shift circuitry 270d includes transistors 430 and 440. The transistors 430 and 440 are NMOS transistors. In other examples, the transistors 430 and 440 are PMOS transistors. The transistor 430 includes a drain node 431 coupled to the voltage node 106, a source node 432 coupled to the capacitor 272, and a gate node 433 coupled to the bias voltage node 340. The transistor 440 includes a drain node 441 coupled to the capacitor 272, a source node 442 coupled to the voltage node 106, and a gate node 443 coupled to the input node 212a. The gate node 443 receives the input signal 211a. The transistors 430 and 440 form a current source circuitry that is configured similar to that of the current source circuitry 260. The phase shift circuitry 270c receives the input signal 211a and generates the signal 271 by applying a phase shift to the input signal 211a to mitigate a change in signal between the gate node 256 and the source node 254. Further, a gain through the transistor 264 applies a gain to the signal (modulation signal) 271 to further mitigate a change in signal between the gate node 256 and the source node 254. The transistors 430 and 440 increase the stability of the signal 271, and increase the supported bandwidth of the source follower circuitry 200c as compared to source follower circuitry that does not include the transistors 430 and 440. Accordingly, the source follower circuitry 200d is able to provide support for high-bandwidth input signals and higher bandwidth communication systems.

Figure 6:
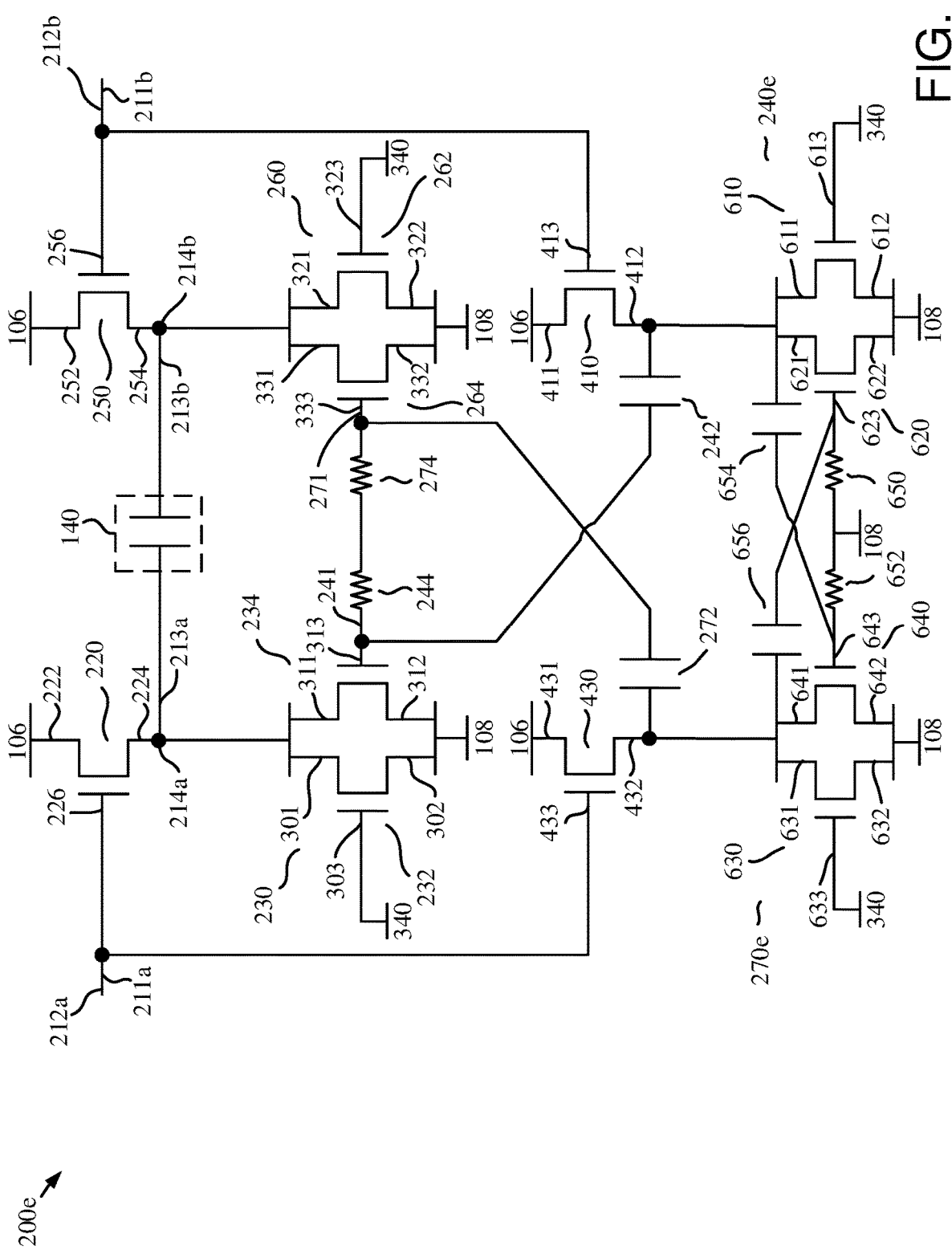
FIG. 6 illustrates a circuit diagram of differential source follower circuitry with phase shift circuitry.

FIG. 6 illustrates a circuit diagram of source follower circuitry 200e, according to one or more examples. The source follower circuitry 200e is configured similar to that of the source follower circuitry 200d. However, as compared to the source follower circuitry 200d, the phase shift circuitry 240e of the source follower circuitry 200e includes transistors 610 and 620 instead of transistor 420 of the phase shift circuitry 240d. Further, the phase shift circuitry 240e includes a resistor 650 coupled to the gate node 623 and a capacitor 656 coupled to the source node 432.

The transistors 610 and 620 are NMOS transistors. In other examples, the transistors 610 and 620 are PMOS transistors. The transistor 610 includes a drain node 611 coupled to the source node 412, a source node coupled to the voltage node 108, and a gate node coupled to the bias voltage node 340. The transistor 620 includes a drain node 621 coupled to the source node 412, a source node 622 coupled to the voltage node 108, and a gate node coupled to the resistor 650 and the capacitor 656.

Compared to the source follower circuitry 200d, the phase shift circuitry 270e of the source follower circuitry 200e includes transistors 630 and 640 instead of transistor 440. Further, the phase shift circuitry 270e includes a resistor 652 coupled to the gate node 643 and a capacitor 654 coupled to the source node 412. The transistors 630 and 640 are NMOS transistors. In other examples, the transistors 630 and 640 are PMOS transistors. The transistor 630 includes a drain node 631 coupled to the source node 432, a source node 632 coupled to the voltage node 108, and a gate node 633 coupled to the bias voltage node 340. The transistor 640 includes a drain node 641 coupled to the source node 432, a source node 642 coupled to the voltage node 108, and a gate node 643 coupled to the resistor 652 and the capacitor 654.

The phase shift circuitry 240e and 270e further increase the linearity of the source follower circuitry 200e as the operating bandwidth increases, as compared to source follower circuitry that includes a different implementation of phase shift circuitry, and/or does not include phase shift circuitry. Accordingly, the source follower circuitry 200e is able to provide support for high-bandwidth input signals and higher bandwidth communication systems while maintaining a high linearity.

While the foregoing is directed to specific examples, other and further examples may be devised without departing from the basic scope thereof, and the scope thereof is determined by the claims that follow.

What is claimed is:

1. A source follower circuitry comprising:
a first input transistor comprising a first node coupled to a first voltage node, a second node coupled to a first output node, and a gate node coupled to a first input node and configured to receive a first input signal via the first input node;
first current source circuitry coupled to the first output node and configured to generate a first bias current, wherein the first current source circuitry has a first current source transistor and a second current source transistor; and
first phase shift circuitry coupled to the first current source circuitry, and configured to generate a first phase shift signal to modulate the first current source circuitry to reduce signal drop across the first input transistor.

2. The source follower circuitry of claim 1 further comprising:
a second input transistor comprising a first node coupled to a first voltage node, a second node coupled to a second output node, and a gate node coupled to a second input node and configured to receive a second input signal via the second input node;
second current source circuitry coupled to the second output node and configured to generate a second bias current; and
second phase shift circuitry coupled to the second current source circuitry, and configured to generate a second phase shift signal to modulate the second bias current to reduce signal drop across the second input transistor.

3. The source follower circuitry of claim 2, wherein:
the first phase shift circuitry is further coupled to the second output node, and configured to generate the first phase shift signal based on an output signal received from the second output node; and
the second phase shift circuitry is further coupled to the first output node, and configured to generate the second phase shift signal based on an output signal received from the first output node.

4. The source follower circuitry of claim 2, wherein:
the first phase shift circuitry is further coupled to the second input node, and configured to generate the first phase shift signal based on the second input signal received from the second output node; and
the second phase shift circuitry is further coupled to the first input node, and configured to generate the second phase shift signal based on the first input signal received from the first output node.

5. The source follower circuitry of claim 1, wherein
the first current source transistor has a first node coupled to the first output node, a second node coupled to a second voltage node, and a gate node coupled to a bias voltage node; and
the second current source transistor has a first node coupled to the first output node, a second node coupled to the second voltage node, and a gate node.

6. The source follower circuitry of claim 5, wherein the first phase shift circuitry comprises a first capacitor and a first resistor, and wherein the first resistor is coupled to the gate node of the second current source transistor.

7. The source follower circuitry of claim 6 further comprising:
a second input transistor having a first node coupled to the first voltage node, a second node coupled to a second output node, and a gate node coupled to a second input node;

second current source circuitry coupled to the second output node and configured to generate a second bias current, the second current source circuitry comprising:
a third current source transistor having a first node couple to the second output node, a second node coupled to the second voltage node, and a gate node coupled to the bias voltage node; and
a fourth current source transistor having a first node couple to the second output node, a second node coupled to the second voltage node, and a gate node; and
second phase shift circuitry coupled to the second current source circuitry, and configured to generate a second phase shift signal to modulate the second current source circuitry to reduce signal drop across the second input transistor.

8. The source follower circuitry of claim 7, wherein the second phase shift circuitry comprises a second capacitor and a second resistor coupled to the gate node of the fourth current source transistor.

9. The source follower circuitry of claim 8, wherein the first capacitor is coupled to the second output node and the second capacitor is coupled to the first output node.

10. The source follower circuitry of claim 8, wherein the first phase shift circuitry further comprises:
a first phase shift transistor comprising a first node coupled to the first voltage node, a second node coupled to a third output node, and a gate node coupled to the bias voltage node; and
a second phase shift transistor comprising a first node coupled to the third output node, a second node coupled to the second voltage node, and a gate node coupled to the second input node, wherein the second phase shift circuitry further comprises:
a third phase shift transistor comprising a first node coupled to the first voltage node, a second node coupled to a fourth output node, and a gate node coupled to the first input node; and
a fourth phase shift transistor comprising a first node coupled to the fourth output node, a second node coupled to the second voltage node, and a gate node coupled to the bias voltage node, and wherein the first capacitor is coupled to the third output node, and the second capacitor is coupled to the fourth output node.

11. The source follower circuitry of claim 8, wherein the first phase shift circuitry further comprises:
a first phase shift transistor comprising a first node coupled to the first voltage node, a second node coupled to a third output node, and a gate node coupled to the second input node;
a second phase shift transistor comprising a first node coupled to the third output node, a second node coupled to the second voltage node, and a gate node coupled to the bias voltage node;
a third phase shift transistor comprising a first node coupled to the third output node, a second node coupled to the second voltage node, and a gate node;
a third capacitor; and
a third resistor coupled to the gate node of the third phase shift transistor, and wherein the second phase shift circuitry further comprises:
a fourth phase shift transistor comprising a first node coupled to the first voltage node, a second node coupled to a fourth output node, and a gate node coupled to the first input node;
a fifth phase shift transistor comprising a first node coupled to the fourth output node, a second node coupled to the second voltage node, and a gate node coupled to the bias voltage node;
a sixth phase shift transistor comprising a first node coupled to the fourth output node, a second node coupled to the second voltage node, and a gate node;
a fourth capacitor coupled to the gate node of the third phase shift transistor; and
a fourth resistor coupled to the gate node of the sixth phase shift transistor, wherein the third capacitor is coupled to the gate node of the sixth phase shift transistor.

12. A communication system comprising:
a capacitive load; and
source follower circuitry configured to drive the capacitive load, the source follower circuitry comprising:
a first input transistor comprising a first node coupled to a first voltage node, a second node coupled to a first output node, and a gate node coupled to a first input node and configured to receive a first input signal via the first input node;
first current source circuitry coupled to the first output node and configured to generate a first bias current, wherein the first current source circuitry has a first current source transistor and a second current source transistor; and
first phase shift circuitry coupled to the first current source circuitry, and configured to generate a first phase shift signal to modulate the first current source circuitry to reduce signal drop across the first input transistor.

13. The communication system of claim 12, wherein the source follower circuitry further comprises:
a second input transistor comprising a first node coupled to the first voltage node, a second node coupled to a second output node, and a gate node coupled to a second input node and configured to receive a second input signal via the second input node;
second current source circuitry coupled to the second output node and configured to generate a second bias current; and
second phase shift circuitry coupled to the second current source circuitry, and configured to generate a second phase shift signal to modulate the second bias current to reduce signal drop across the second input transistor.

14. The communication system of claim 13, wherein:
the first phase shift circuitry is further coupled to the second output node, and configured to generate the first phase shift signal based on an output signal received from the second output node; and
the second phase shift circuitry is further coupled to the first output node, and configured to generate the second phase shift signal based on an output signal received from the first output node.

15. The communication system of claim 13, wherein:
the first phase shift circuitry is further coupled to the second input node, and configured to generate the first phase shift signal based on the second input signal received from the second output node; and
the second phase shift circuitry is further coupled to the first input node, and configured to generate the second phase shift signal based on the first input signal received from the first output node.

16. The communication system of claim 12, wherein the first current source circuitry comprises:
the first current source transistor has a first node coupled to the first output node, a second node coupled to a second voltage node, and a gate node coupled to a bias voltage node; and
the second current source transistor has a first node coupled to the first output node, a second node coupled to the second voltage node, and a gate node.

17. The communication system of claim 16, wherein the source follower circuitry further comprises:
a second input transistor having a first node coupled to the first voltage node, a second node coupled to a second output node, and a gate node coupled to a second input node;
second current source circuitry coupled to the second output node and configured to generate a second bias current, the second current source circuitry comprising:
a third current source transistor having a first node couple to the second output node, a second node coupled to the second voltage node, and a gate node coupled to the bias voltage node; and
a fourth current source transistor having a first node couple to the second output node, a second node coupled to the second voltage node, and a gate node; and
second phase shift circuitry coupled to the second current source circuitry, and configured to generate a second phase shift signal to modulate the second current source circuitry to reduce signal drop across the second input transistor.

18. The communication system of claim 17, wherein a first capacitor is coupled to the second output node and a second capacitor is coupled to the first output node.

19. The communication system of claim 17, wherein the first phase shift circuitry further comprises:
a first phase shift transistor comprising a first node coupled to the first voltage node, a second node coupled to a third output node, and a gate node coupled to the bias voltage node;
a second phase shift transistor comprising a first node coupled to the third output node, a second node coupled to the second voltage node, and a gate node coupled to the second input node; and
a first capacitor, wherein the second phase shift circuitry further comprises:
a third phase shift transistor comprising a first node coupled to the first voltage node, a second node coupled to a fourth output node, and a gate node coupled to the first input node; and
a fourth phase shift transistor comprising a first node coupled to the fourth output node, a second node coupled to the second voltage node, and a gate node coupled to the bias voltage node; and
a second capacitor coupled to the third output node, and wherein the first capacitor is coupled to the fourth output node.

20. A differential source follower circuitry comprising:
a first input transistor comprising a first node coupled to a first voltage node, a second node coupled to a first output node, and a gate node coupled to a first input node and configured to receive a first input signal via the first input node;
a second input transistor comprising a first node coupled to the first voltage node, a second node coupled to a second output node, and a gate node coupled to a second input node and configured to receive a second input signal via the second input node;
first current source circuitry coupled to the first output node and configured to generate a first bias current;
second current source circuitry coupled to the second output node and configured to generate a second bias current;
first phase shift circuitry coupled to the first current source circuitry, and configured to generate a first phase shift signal to modulate the first current source circuitry to reduce signal drop across the first input transistor; and
second phase shift circuitry coupled to the second current source circuitry, and configured to generate a second phase shift signal to modulate the second current source circuitry to reduce signal drop across the second input transistor.

* * * * *